United States Patent
Tachibana et al.

(12)

(10) Patent No.: US 6,284,565 B1
(45) Date of Patent: Sep. 4, 2001

(54) METHOD OF RESIN-ENCAPSULATING SEMICONDUCTOR CHIP AND MOLD-RELEASING FILM USED FOR THE METHOD

(75) Inventors: Toshimitsu Tachibana; Kenji Sato; Mitsuo Iimura, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/515,849

(22) Filed: Feb. 29, 2000

(30) Foreign Application Priority Data

Apr. 6, 1999 (JP) .................................................. 11-098511

(51) Int. Cl.⁷ ........................... H01L 21/44; H01L 21/48; H01L 21/50
(52) U.S. Cl. ............................................. 438/106; 438/127
(58) Field of Search ..................................... 438/106, 112, 438/124, 127, 118, 125, 126; 425/115, 116, 121, 183, 190, 544; 264/272.17, 328; 29/25.01

(56) References Cited

U.S. PATENT DOCUMENTS

| | | | |
|---|---|---|---|
| 4,954,308 | * 9/1990 | Yabe et al. | 264/272.17 |
| 5,882,692 | * 3/1999 | Kojima et al. | 425/116 |
| 5,912,320 | * 6/1999 | Hotta et al. | 528/373 |
| 5,998,243 | * 12/1999 | Odashima et al. | 438/127 |
| 6,081,978 | * 7/2000 | Utsumi et al. | 29/25.01 |

\* cited by examiner

*Primary Examiner*—David Nelms
*Assistant Examiner*—Phuc T. Dang
(74) *Attorney, Agent, or Firm*—Sughrue, Mion, Zinn, Macpeak & Seas, PLLC

(57) ABSTRACT

In a method of resin-encapsulating a semiconductor chip using a polytetrafluoroethylene film as the mold-releasing film, a polytetrafluoroethylene film F wherein the thermal shrinkage percentages thereof in both the longitudinal direction and the width direction are 5% or lower, the difference of the thermal shrinkage percentages is within 3%, and the ratio of the elastic modulus of the longitudinal direction to the elastic modulus of the width direction is from 0.5 to 2.0 during resin encapsulating is used. By using the mold-releasing film, resin encapsulating can be carried out with an excellent yield while preventing the occurrence of resin covering of the terminals or the top surfaces of the post electrodes.

5 Claims, 2 Drawing Sheets

METHOD OF RESIN-ENCAPSULATING SEMICONDUCTOR CHIP AND MOLD-RELEASING FILM USED FOR THE METHOD

FIELD OF THE INVENTION

The present invention relates to a method of resin-encapsulating a semiconductor chip and a mold-releasing film used in the method.

BACKGROUND OF THE INVENTION

In the package of semiconductor chips, the use of CSP (Chip Scale Package) has proceeded and a mold-releasing film is used in place of compounding a mold-releasing agent with a encapsulating resin to increase the mold-releasing property, whereby the improvement of the working efficiency by the reduction of a mold-cleaning frequency, the reduction of cost by prolonging the life of mold, etc., have been attempted. In this case, it is proposed to use a polytetrafluoroethylene film as the releasing film (JP-A-8-197567, JP-A-8-186141, etc.) (the term "JP-A" as used herein means an "unexamined published Japanese patent application").

FIG. 1 shows QFN (Quad Flat Package) of the structure formed by removing the lower surface mold portion from QFP and cutting off the lead at the side from the mold side portion. In the case of carrying out resin encapsulating thereof, the electrode of a semiconductor chip 2 is bonded to the terminal 22 of each lead frame 21 with a wire, the semiconductor chip 2 is placed in the cavity 11 of a lower mold 1 with the terminals 22 being at the upper side as shown in FIG. 1(A), the mold is closed by an upper mold 3 via a polytetrafluoroethylene film F and a resin is injected into the cavity by a transfer molding and is simultaneously cured as shown in FIG. 1(B), the mold is then opened as shown in FIG. 1(C), and the lead frames are trimmed leaving the terminals.

In the resin-encapsulating method, it is expected that the terminals bites into the polytetrafluoroethylene film by the mold closing pressure, whereby the terminals and the polytetrafluoroethylene film are always maintained at a contact state during resin encapsulating to exclude the occurrence of resin covering of the terminals.

As well known, the polytetrafluoroethylene film can be obtained by a casting method (a method of coating a dispersion of polytetrafluoroethylene on a carrier sheet followed by sintering and releasing the sintered film from the carrier sheet), a cutting method (a method of sintering a polytetrafluoroethylene rod and cutting the rod by a cutting lathe into a film), etc.

However, when the present inventors performed resin-encapsulating of semiconductor chips using the polytetrafluoroethylene film as the mold-releasing film, in spite of that there was no substantial difference in the modulus of elasticity and the exclusion of the occurrence of resin-covering of the terminal was similarly expected by cutting the terminals into the polytetrafluoroethylene film by mold-closing pressure to always maintain the terminals and the polytetrafluoroethylene film at a contact state during resin encapsulating, it has been found that the generation ratio of resin covering (inferiority ratio) of the above-described terminals considerably differs (practically, there is a difference of the inferiority ratio in the range of from 0 to 10/50) according to the difference in the above-described production method of the polytetrafluoroethylene film.

Accordingly, the inventors made the investigations on the cause thereof and have found that the cause is in the difference in the thermal shrinkage percentages between the lengthwise direction and the width direction of the mold-releasing film. That is, it is presumed that when a film has a directional property in the thermal shrinkage percentage, a force which shears and deforms the film slantingly is applied to the film to thereby cause creases.

SUMMARY OF THE INVENTION

Therefore, an object of the present invention is to provide a method of carrying out resin encapsulating of a semiconductor chip using the polytetrafluoroethylene film as the mold-releasing film, wherein resin encapsulating can be carried out at an excellent yield while preventing the occurrence of resin covering of the terminals or the top surfaces of electrodes.

That is, the first aspect of this invention is a method of resin-encapsulating a semiconductor chip by closing a lower mold having disposed in a cavity thereof a semiconductor chip equipped with terminals or post electrodes by an upper mold via a mold-releasing film made of a polytetrafluoroethylene film between the surface on which the terminals or the post electrodes are disposed and the upper mold and then injecting a resin into the cavity of the lower mold while curing, wherein a polytetrafluoroethylene film satisfies the conditions that the thermal shrinkage percentages in the longitudinal and width directions are 5% or lower, the difference between the thermal shrinkage percentages is within 3% and the ratio of the elastic modulus of the longitudinal direction to the elastic modulus of the width direction is from 0.5 to 2.0 during resin encapsulating.

The second aspect of this invention is a mold-releasing film used for a method of resin-encapsulating a semiconductor chip, wherein the mold-releasing film is made of a polytetrafluoroethylene film satisfying the conditions that the thermal shrinkage percentages in the longitudinal and width directions at 175° C. for 10 minutes are 5% or lower, the difference between the thermal shrinkage percentages is within 3%, and the ratio of the elastic modulus of the longitudinal direction to the elastic modulus of the width direction is from 0.5 to 2.0, and preferably from 0.8 to 1.5 during resin encapsulating. In the mold-releasing film made of the above-described polytetrafluoroethylene film, it is preferred that the breaking elongation percentages in the longitudinal direction and the width direction thereof at 175° C. are both at least 600% and further it is preferred that the surface roughness Ra (by a JIS B 0601 method) thereof is 0.3 μm or lower, and preferably 0.2 μm or lower.

DETAILED DESCRIPTION OF THE INVENTION

Then, the present invention is described in detail.

The polytetrafluoroethylene film used for resin encapsulating a semiconductor chip in this invention, that is, the polytetrafluoroethylene film satisfying the conditions that the thermal shrinkage percentages in the longitudinal and width directions at 175° C. for 10 minutes are 5% or lower, the difference between the thermal shrinkage percentages is within 3%, and the ratio of the elastic modulus of the longitudinal direction to the elastic modulus of the width direction is from 0.5 to 2.0, and preferably from 0.8 to 1.5, can be obtained by a casting method. For example, the polytetrafluoroethylene film can be obtained by coating a dispersion of polytetrafluoroethylene on a heat-resisting carrier sheet, sintering it at a temperature of at least the melting point of polytetrafluoroethylene, and then releasing the sintered film from the carrier sheet. In this case, the coated layer may be sintered by one-stage heating at a single stroke but it is preferred to use multistage heating of first heating the coated layer to the evaporation temperature of the dispersion medium of the dispersion of polytetrafluoroethylene to evaporate a part or the greater part of the dispersion medium and then sintering by heating the layer to a temperature of at least the melting point of the polytetrafluoroethylene. Coating can be carried out by not only a dipping method, but also a spray coating method, a brush coating method and the like.

The thickness of the releasing film made of the polytetrafluoroethylene film is generally from 20 to 100 μm, and preferably from 20 to 50 μm. A polytetrafluoroethylene film having a thickness of from 20 to 100 μm can be usually prepared by repeating several times a method of sintering by heating of the coated dispersion of polytetrafluoroethylene and coating of the dispersion of polytetrafluoroethylene.

Also, to more smoothly carry out releasing of the above-described sintered film, the carrier sheet can be coated with a releasing agent such as a silicone-based releasing agent, etc.

As the above-described heat-resisting carrier sheet, a proper sheet being capable of enduring the sintering temperature of the dispersion of polytetrafluoroethylene sheet can be used. Examples thereof include a plastic film such as polyimide film, a polyether ether ketone film and a polyether sulfone film, and a metal foil.

As the dispersion medium of the dispersion of polytetrafluoroethylene described above, for example, water can be used. The solid component concentration of the dispersion of polytetrafluoroethylene is preferably from 20 to 80% by weight, and particularly preferably from 40 to 60% by weight from the point of workability.

Figure 1:
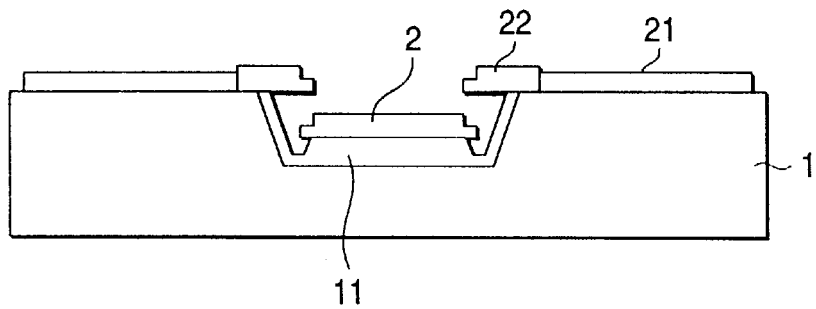
FIG. 1(A)–FIG. 1(C) are views showing a method of resin-encapsulating a semiconductor chip of this invention and FIG. 2(A) and FIG. 2(B) are views showing the lead frame in FIG. 1.
Figure 1:
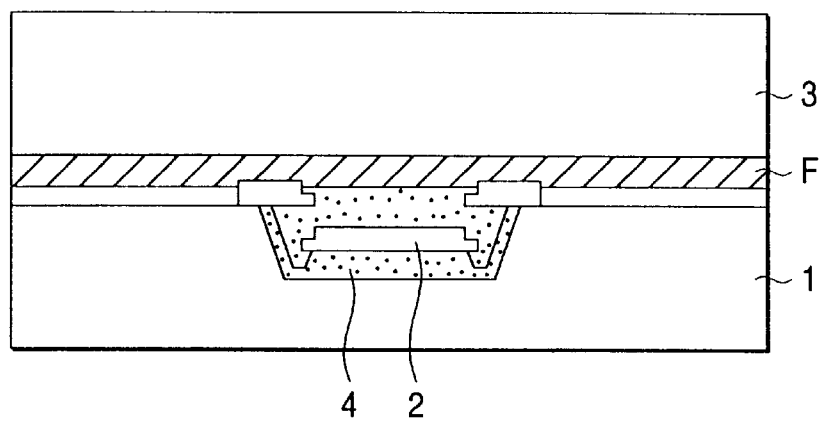
Figure 1:
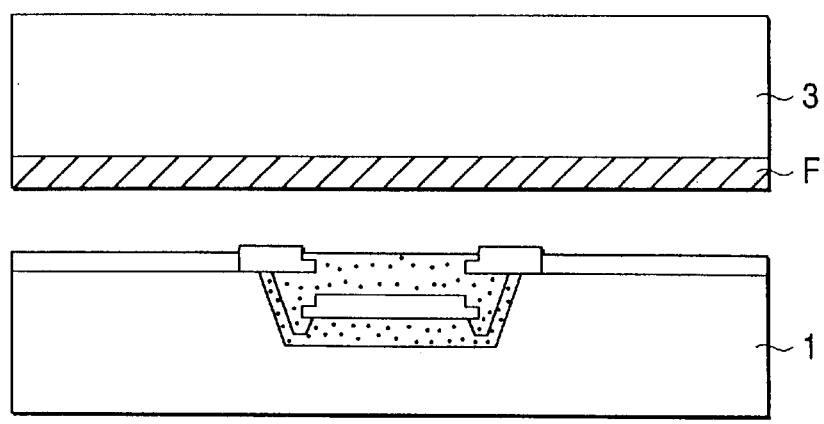
Figure 2A:
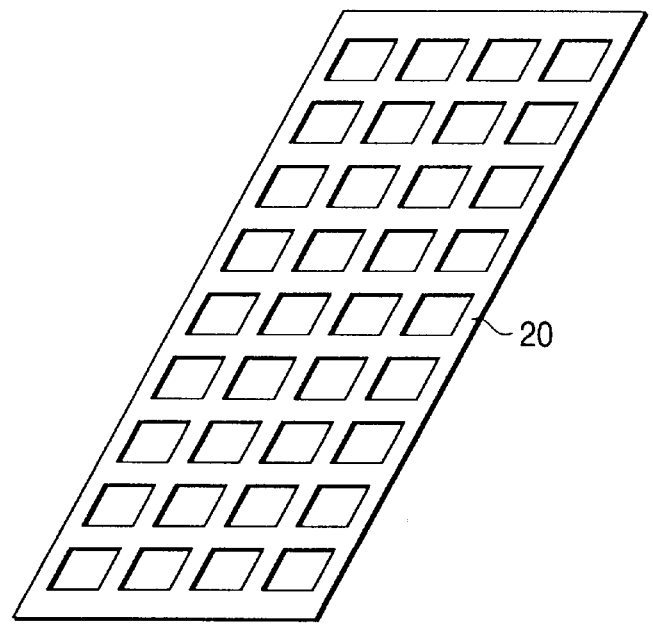

FIG. 1(A) to FIG. 1(C) show an embodiment of the method of resin-encapsulating a semiconductor chip using the mold-releasing film of this invention. The object to be encapsulated is a semiconductor chip in which inner terminals 22 of each unit 21(FIG. 2(B)) of the lead frame 20 shown in FIG. 2(A) are bonded to the chip electrodes by wires. In FIGS. 1(A) to 1(C), only one unit of the lead frame is shown for simplifying the explanation.

First, as shown in FIG. 1(A), a semiconductor chip 2 is placed in a cavity 11 of a heated lower mold 1 of a transfer injection apparatus with terminals 22 being at the upper side, furthermore, as show in FIG. 1(B), the mold is closed by an upper mold 3 via a mold-releasing film F made of polytetrafluoroethylene, a resin 4 is injected into the cavity followed by curing, then, as shown in FIG. 1(C), the mold is opened by raising the upper mold 3 and the mold-releasing film F made of polytetrafluoroethylene is then released from the encapsulating resin 4. Thereafter, the lead frames are trimmed leaving the terminals to obtained QFN.

In the above-described procedure, the resin-encapsulating conditions are, for example, a temperature of 175° C. and a molding pressure of 50 kg/cm², and such heating, the polytetrafluoroethylene film tends to be shrank but because the kinematic friction coefficient of the polytetrafluoroethylene film is very low (usually, 0.2 or lower), the friction resistance does not act to the heat shrinkage of the polytetrafluoroethylene film and it can be presumed that only the intermolecular chain of polytetrafluoroethylene resists to the heat shrinkage. Thus, when the thermal shrinkage percentage of the polytetrafluoroethylene film in the lengthwise direction is βx, the elastic modulus thereof in the lengthwise direction is Ex, the thermal shrinkage percentage of the polytetrafluoroethylene film in the width direction is βy, the elastic modulus thereof in the width direction is Ey, the stress in the lengthwise direction is δx, and the stress in the width direction is δy, the following relations are obtained;

$$\delta x = \beta x \cdot Ex \quad (1)$$

$$\delta y = \beta y \cdot Ey \quad (2)$$

In this invention, because βx and βy are 5% or less, the difference of βx and βy is within 3%, and the ratio of Ex to Ey is defined to be 0.5 to 2.0, δx and δy can be made almost equal and sufficiently small, the directional property of the stress can be restrained well, the occurrence of the slanting deformation, in shearing, of the polytetrafluoroethylene film is excluded well and the occurrence of creases can be sufficiently prevented.

Accordingly, in this invention, while preventing the propagation of creases to the surface boundary between the polytetrafluoroethylene film and the terminals, the close-contact state of the surface boundary between the polytetrafluoroethylene film and the terminals by biting of the terminals in the polytetrafluoroethylene film can be stably maintained during resin encapsulating, whereby the occurrence of resin covering of the terminals can be surely prevented.

This can be confirmed from the comparison of the examples with the comparative examples described below.

In addition, it is preferred in the present invention to use the polytetrafluoroethylene film which further satisfying the condition that the breaking elongation percentages in the lengthwise direction and the width direction at 175° C. are both at least 600%, such that the polytetrafluoroethylene film is not broken under the mold closing pressure of the upper mold at the portion where the polytetrafluoroethylene film is brought into contact with the edges of the terminals.

Also, because when the surface roughness of the polytetrafluoroethylene film is large, the precision of the contact surface boundary of the polytetrafluoroethylene film and the terminals is reduced, which results in making disadvantageous for excluding the entrance of a resin at resin encapsulating, it is preferred that the surface roughness Ra of the polytetrafluoroethylene film is 0.3 μm or lower.

Figure 2B:
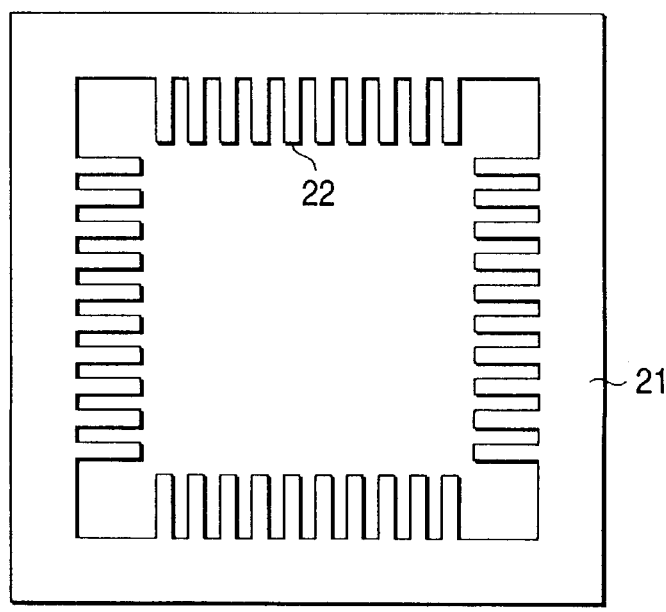

Furthermore, in the method of resin-encapsulating a semiconductor chip according to this invention, the object to be resin-encapsulated is a semiconductor chip having a construction where electrode current passing members (for example, terminal 22 in FIGS. 1(A) and 2(B)) are exposed on the surface resin-encapsulated such that they can be soldered and bonded to a substrate at mounting the semiconductor chip, and examples thereof include a semiconductor chip having post electrodes of which the top surface are to be exposed after resin-encapsulating.

The following examples are intended to illustrate the present invention practically but not to limit the invention in any way.

EXAMPLE 1

A polytetrafluoroethylene mold-releasing film having a thickness of 50 μm was prepared by repeating four times a method of dip-coating an aqueous dispersion of a polytetrafluoroethylene powder (particle sizes of about 0.25 μm) at a solid component concentration of 50% by weight on a polyimide carrier, removing water by heating to 90° C. for 2 minutes, and then sintering the coated layer at 360° C. for 2 minutes.

When the shrinkage percentages in both the lengthwise direction and the width direction and the elastic moduluses in both the lengthwise direction and the width direction of the polytetrafluoroethylene film after heating to 175° C. for 10 minutes were measured and the results were as shown in Table 1 below.

When using the polytetrafluoroethylene film as a mold-releasing film, 50 QFNs were molded by the method shown in FIGS. 1(A) to 1(C) at a temperature of 175° C. and a pressure of 50 kg/cm² for a molding time of 120 seconds, the number of the products having formed resin covering on the terminals was zero (i.e., the inferiority ratio was 0/50).

Also, when the polytetrafluoroethylene film was set by rotating at 90° and resin encapsulating was carried out by the same manner as above, the inferiority ratio was also 0.

In addition, about the polytetrafluoroethylene film used in the example, the surface roughness in the longitudinal direction was 0.06 μm, the surface roughness in the width direction was 0.08 μm, the breaking elongation percentage in the lengthwise direction was 820%, the breaking elongation percentage in the width direction was 780%, and the kinematic friction coefficient was 0.16.

EXAMPLE 2

A polytetrafluoroethylene mold-releasing film having a thickness of 50 μm was prepared by repeating three times a method of dip-coating an aqueous dispersion of a polytetrafluoroethylene powder (particle sizes of about 0.25 μm) at a solid component concentration of 60% by weight on a polyimide carrier and after removing water by heating to 90° C. for 2 minutes, sintering the coated layer at 360° C. for 2 minutes.

When the shrinkage percentages in both the lengthwise direction and the width direction and the elastic moduluses in both the lengthwise direction and the width direction of the polytetrafluoroethylene film after heating to 175° C. for 10 minutes were measured and the results were as shown in Table 1 below.

When using the polytetrafluoroethylene film as a mold-releasing film, 50 QFNs were molded by the same manner as Example 1, the number of the products having formed resin covering on the terminals was one (i.e., the inferiority ratio was 1/50).

Also, when the polytetrafluoroethylene film was set by rotating at 90° and resin encapsulating was carried out by the same manner as above, the inferiority ratio was not changed.

Comparative Example 1

A polytetrafluoroethylene molding powder was packed in a cylindrical mold, pre-molded at a pressure of 200 kg/cm² for 1 hour, the pre-molded product was sintered at 380° C. for 3 hours, the sintered product was cut by a cutting lathe into a thickness of 55 μm, and after contacting the cut film with a heat roll at 300° C. for 1 minute to remove strain, the cut film was heat treated of 5% drawing. Thus, a polytetrafluoroethylene mold-releasing film having a thickness of 50 μm was prepared.

When the shrinkage percentages in both the lengthwise direction and the width direction and the elastic moduluses in both the lengthwise direction and the width direction of the polytetrafluoroethylene film after heating to 175° C. for 10 minutes were measured and the results were as shown in Table 1 below.

When using the polytetrafluoroethylene film as a mold-releasing film, 50 QFNs were molded by the same manner as Example 1, the number of the products having formed resin covering on the terminals was 7 (i.e., the inferiority ratio was 7/50).

In addition, about the polytetrafluoroethylene film used in the example, the surface roughness in the longitudinal direction was 0.32 μm, the surface roughness in the width direction was 0.39 μm, the breaking elongation percentage in the lengthwise direction was 660%, the breaking elongation percentage in the width direction was 770%, and the kinematic friction coefficient was 0.15.

Comparative Example 2

A polytetrafluoroethylene film prepared by following the same procedure as Comparative Example 1 except that the thickness of the film was changed to 48 μm by carrying out the heat treatment of 10% drawing in place of the heat treatment of 5% drawing in Comparative Example 1 was used.

When the shrinkage percentages in both the lengthwise direction and the width direction and the elastic moduluses in both the lengthwise direction and the width direction of the polytetrafluoroethylene film after heating to 175° C. for 10 minutes were measured and the results were as shown in Table 1 below.

When using the polytetrafluoroethylene film as a mold-releasing film, 50 QFNs were molded by the same manner as Example 1, the number of the products having formed resin covering on the terminals was 17 (i.e., the inferiority ratio was 17/50).

In addition, about the polytetrafluoroethylene film used in the comparative example, the surface roughness in the longitudinal direction was 0.34 μm, the surface roughness in the width direction was 0.35 μm, the breaking elongation percentage in the lengthwise direction was 580%, the breaking elongation percentage in the width direction was 780%, and the kinematic friction coefficient was 0.15.

Comparative Example 3

An ethylene-tetrafluoroethylene copolymer was molded by a T-die extruding machine at a die temperature of 340° C., a lip interval of 0.6 mm, and a pulling speed of 5 meters/minute, a mold-releasing film made of the ethylene-tetrafluoroethylene copolymer having a thickness of 50 μm was prepared.

When the shrinkage percentages in both the lengthwise direction and the width direction and the elastic moduluses in both the lengthwise direction and the width direction of the ethylene-tetrafluoroethylene copolymer film after heating to 175° C. for 10 minutes were measured and the results were as shown in Table 1 below.

When using the ethylene-tetrafluoroethylene copolymer film as a mold-releasing film, 50 QFNs were molded by the same manner as Example 1, the number of the products having formed resin covering on the terminals was 16 (i.e., the inferiority ratio was 16/50).

In addition, about the ethylene-tetrafluoroethylene copolymer film used in the comparative example, the surface roughness in the longitudinal direction was 0.13 μm, the width roughness in the width direction was 0.19 μm, the breaking elongation percentage in the lengthwise direction was 720%, the breaking elongation percentage in the width direction was 1120%, and the kinematic friction coefficient was 0.41.

The measurement methods of the properties of each films described above are as follows.

Elastic Modulus

The storage elastic modulus of each film of 20 mm×10 mm was measured using a viscoelastic spectrometer DMS 6100 (manufactured by Seiko Instruments Inc.) under the conditions of a temperature-raising speed of 2° C./minute and a frequency of 1 Hz.

Thermal Shrinkage Percentage

The percentage of the ratio of the changed amount of the length of the sample (at about 23° C.) after heating the sample to 175° C. for 10 minutes to the length of the sample (at about 23° C.) before heating was obtained.

Breaking Elongation Percentage

According to JIS K7113, using a No. 2 shape as a test piece, the moved distance (mm) T of a cross head was measured at a pulling speed of 200 mm/minutes and a temperature of 175° C., and 100T %/S was obtained, wherein S was the distance (25 mm) between the marked liens.

Surface Roughness

According to JIS B0601, Ra ($\mu$m) was measured.

Kinematic Friction Coefficient

By a Bowden-Leben method, the evaluation to a steel ball was carried out at a load weight of 100 g and a driving speed of 600 mm/minute.

TABLE 1

| | Elastic Modulus ($\times 10^8$ Pa) | | Thermal Shrinkage Percentage (%) | |
|---|---|---|---|---|
| | Lengthwise direction | Width direction | Lengthwise direction | Width direction |
| Example 1 | 1.5 | 1.7 | 3 | 2 |
| Example 2 | 1.7 | 2.5 | 5 | 2 |
| Comparative Example 1 | 2.0 | 4.3 | 5 | 0 |
| Comparative Example 2 | 1.8 | 4.1 | 7 | −1 |
| Comparative Example 3 | 1.4 | 1.7 | 11 | 6 |

The results in Table 1 show as follows.

In Comparative Example 1, a resin entrance to the surface boundary between the polytetrafluoroethylene film and the terminals relatively easily occurred. This appears to be because the pulling stress occurred in the lengthwise direction only and the pulling stress did not occur in the width direction, that is, the directional property of the pulled stress state was remarkable.

In Comparative Example 2, the resin entrance into the surface boundary of the polytetrafluoroethylene film and the terminals remarkably occurred. This appears to be because an elongation occurred in the width direction of the polytetrafluoroethylene film to cause looseness of the polytetrafluoroethylene film.

In Comparative Example 3, the ratio of the elastic moduluses of the ethylene-tetrafluoroethylene copolymer film in the longitudinal direction to the width direction belongs to the range of from 0.5 to 2.0 but it is assumed that because the thermal shrinkage percentage thereof is too large as 5% or larger, the resin entrance to the surface boundary of the ethylene-tetrafluoroethylene copolymer film and the terminal remarkably occurred.

On the other hand, in Examples 1 and 2 which use the polytetrafluoroethylene film satisfying the conditions that the thermal shrinkage percentages in both the lengthwise direction and the width direction are 5% or lower, the difference of the thermal shrinkage percentages thereof is within 3%, and the ratio of the elastic coefficients thereof of the longitudinal direction to the width direction is in the range of from 0.5 to 2.0 during resin encapsulating, whereby the stresses δx and δy in both the longitudinal direction and the width direction obtained from the above-described equations (1) and (2) can be made sufficiently equal and small to exclude the directional property of the stress well, the resin entrance to the surface boundary of the polytetrafluoroethylene film and the terminals was zero or very less.

As described above, in the case of resin encapsulating a semiconductor chip using a mold-releasing film while exposing the surfaces of the terminals and the tops of the electrode posts, the semiconductor chip can be resin-encapsulated with an excellent yield by surely excluding the occurrence of resin covering the surfaces of the terminals and the tops of the post electrodes according to this invention, and as the result thereof, the improvement of the working efficiency by the reduction of the number of cleaning mold, the reduction of cost by prolonging the life of the mold, and the simplification of the structure of the mold by omitting eject pins, etc., can be practiced.

While the invention has been described in detail and with reference to specific embodiments thereof, it will be apparent to one skilled in the art that various changes and modifications can be made therein without departing from the spirit and scope thereof.

What is claimed is:

1. A method of resin-encapsulating a semiconductor chip by closing a lower mold having disposed in a cavity thereof a semiconductor chip equipped with terminals or post electrodes by an upper mold via a mold-releasing film made of a polytetrafluoroethylene film between the surface on which the terminals or the post electrodes are disposed and the upper mold and then injecting a resin into the cavity of the lower mold and cured, the polytetrafluoroethylene film satisfying the conditions that the thermal shrinkage percentages in the longitudinal and width directions are 5% or lower, the difference between the thermal shrinkage percentages is within 3%, and the ratio of the elastic modulus of the longitudinal direction to the elastic modulus of the width direction is from 0.5 to 2.0 during resin encapsulating.

2. A mold-releasing film used for a method of resin-encapsulating a semiconductor chip, wherein the mold-releasing film is made of a polytetrafluoroethylene film which satisfies the conditions that the thermal shrinkage percentages in the longitudinal and width directions at 175° C. for 10 minutes are 5% or lower, the difference between the thermal shrinkage percentages is within 3%, and the ratio of the elastic modulus of the longitudinal direction to the elastic modulus of the width direction is from 0.5 to 2.0 during resin encapsulating.

3. The mold-releasing film of claim 2, which further satisfies the condition that the breaking elongation percentages in the longitudinal direction and the width direction thereof at 175° C. are both at least 600%.

4. The mold-releasing film of claim 2, which further satisfies the condition that a surface of the film exposed to a resin to be encapsulated, has a surface roughness Ra of 0.3 $\mu$m or lower.

5. The mold-releasing film of claim 3, which further satisfies the condition that a surface of the film exposed to a resin to be encapsulated, has a surface roughness Ra of 0.3 $\mu$m or lower.

* * * * *